United States Patent [19]

Ikeda

[11] Patent Number: 5,553,233
[45] Date of Patent: Sep. 3, 1996

[54] MANAGEMENT APPARATUS FOR VOLUME-MEDIUM CORRESPONDENCE INFORMATION FOR USE IN DUAL FILE SYSTEM

[75] Inventor: Akio Ikeda, Tokyo, Japan

[73] Assignee: NEC Corporation, Tokyo, Japan

[21] Appl. No.: 511,098

[22] Filed: Aug. 4, 1995

Related U.S. Application Data

[63] Continuation of Ser. No. 174,407, Dec. 28, 1993, abandoned.

[30] Foreign Application Priority Data

Dec. 28, 1992 [JP] Japan ................................. 4-360618

[51] Int. Cl.$^6$ ............................ G06F 15/00; G06F 11/22
[52] U.S. Cl. ............... 395/182.11; 395/181; 395/183.07; 395/182.09; 395/182.18; 395/183.17; 395/600; 364/DIG. 1; 364/269.3; 364/285.1; 364/285.3
[58] Field of Search ............................ 395/182.11, 181, 395/183.07, 182.09, 182.18, 183.17, 600; 364/DIG. 1; 371/11.3

[56] References Cited

U.S. PATENT DOCUMENTS

| | | | |
|---|---|---|---|
| 4,084,231 | 4/1978 | Cabozzi et al. | 364/200 |
| 4,807,224 | 2/1989 | Naron et al. | 370/94 |
| 5,073,833 | 12/1991 | Best et al. | 360/77.05 |
| 5,089,958 | 2/1992 | Horton et al. | 395/575 |
| 5,163,148 | 11/1992 | Walls | 395/600 |
| 5,202,982 | 4/1993 | Gramlich et al. | 395/600 |
| 5,239,659 | 8/1993 | Rudeseal et al. | 395/800 |
| 5,276,867 | 1/1994 | Kenley et al. | 395/600 |
| 5,307,481 | 4/1994 | Shimazaki et al. | 395/575 |
| 5,317,728 | 5/1994 | Tevis et al. | 395/600 |

Primary Examiner—Thomas G. Black
Assistant Examiner—Jean R. Homere
Attorney, Agent, or Firm—Foley & Lardner

[57] ABSTRACT

A management apparatus for volume-medium correspondence information for use in a dual file system. A volume-medium correspondence information management table stores volume-medium correspondence information. Also included is a volume-medium correspondence information storage file. The volume-medium correspondence information in the volume-medium correspondence information management table is written to the volume-medium correspondence information storage file. The volume-medium correspondence information in the volume-medium correspondence information management table is updated. The volume-medium correspondence information is recovered when the dual file system is to be reactuated. A volume in an off-line state is provisionally allocated to dual files including a blockaded medium based on the volume-medium correspondence information management table.

17 Claims, 3 Drawing Sheets

FIG. 2

VOLUME-MEDIUM CORRESPONDENCE INFORMATION

|  |  |  |  |  |
|---|---|---|---|---|
| FIRST DUAL FILES | VOLUME NAME | MEDIUM NAME | VOLUME NAME | MEDIUM NAME |
| SECOND DUAL FILES | VOLUME NAME | MEDIUM NAME | VOLUME NAME | MEDIUM NAME |
| THIRD DUAL FILES | VOLUME NAME | MEDIUM NAME | VOLUME NAME | MEDIUM NAME |
|  |  |  |  |  |

FIG. 4

START
↓ ─43
MEASURE FIXED TIME INTERVAL WITH TIMER
↓ ─44
WRITE VOLUME-MEDIUM CORRESPONDENCE INFORMATION IN VOLUME-MEDIUM CORRESPONDENCE INFORMATION MANAGEMENT TABLE 2 INTO VOLUME-MEDIUM CORRESPONDENCE INFORMATION STORAGE FILE 6 UPON EVERY PASSAGE OF THAT TIME INTERVAL
↓
END

START
↓ ─45
WRITE VOLUME-MEDIUM CORRESPONDENCE INFORMATION IN VOLUME-MEDIUM CORRESPONDENCE INFORMATION MANAGEMENT TABLE 2 INTO VOLUME-MEDIUM CORRESPONDENCE INFORMATION STORAGE FILE 6 EVERY TIME VOLUME-MEDIUM CORRESPONDENCE INFORMATION IS UPDATED
↓
END

MANAGEMENT APPARATUS FOR VOLUME-MEDIUM CORRESPONDENCE INFORMATION FOR USE IN DUAL FILE SYSTEM

This application is a continuation of application Ser. No. 08/174,407, filed Dec. 28, 1993, now abandoned.

DETAILED DESCRIPTION OF THE INVENTION

The present invention relates to a dual file system to ensure high reliability by duplicating files and storing the same data in each of the duplicated files, and more particularly to an apparatus to manage information indicating correspondence between auxiliary memory units, such as magnetic disk units, and auxiliary memory media, such as magnetic disks, in a dual file system.

BACKGROUND OF THE INVENTION

In dual file systems according to the prior art, each having one or more pairs of dual files, the following processing steps are taken to establish correspondence between media constituting dual files and units into which the media are assembled.

(1) When actuating a dual file system, the operating system of the dual file system automatically recognizes the names of the media assembled into volumes in an on-line state and, if it succeeds in recognizing two media to constitute a pair of dual files, will set, in allocation information, information to the effect that the volumes into which those media are assembled are to be allocated to the dual files. In accessing those dual files, those volumes are allocated to the dual files. Thereafter, the dual files for which the information is set in the allocation information are operated in a dual state, while other dual files are operated in a non-dual state.

(2) When operating a dual file system, if failure occurs to one of the media of a pair of dual files operated in a dual state, the operating system of the dual file system will place off-line state (blockade) the volume into which the blockaded medium is assembled, and performs control so as to operate the dual files on a single line. However, since information indicating the allocation of the volume is maintained in the allocation information, the dual state of the dual files is retained.

(3) If, after the occurrence of a failure as described in (2), the dual file system stops operating for any reason and is to be re-actuated subsequently, the volume in which the blockaded medium is assembled will remain in an off-line state, and the allocation information will have also been deleted as a result of the system stop, the dual files involving the blockaded medium cannot be operated in a dual state by using that volume. In other words, the dual files have to be operated in a non-dual state only by another medium than the blockaded one. This holds true irrespective of whether or not the recovery of the data in the blockaded medium has been completed by the time the dual files are to be re-operated. For a technique regarding data recovery in media, reference may be made to "ACOS-4/XVP DFCF/TBCF REFERENCE MANUAL, DFB81E-2, NEC Corporation, 1991, 1992" (DFCF: Dual File Control Facility, TBCF: Track Blockade Control Facility).

Thus, according to the prior art, information indicating the state of correspondence between the volumes and media regarding dual files is not inherited from before to after a system stop.

If the blockaded medium after the recovery of data is assembled into another volume in an on-line state and reactuated, the dual files including that blockaded medium can be operated in a dual state. However, from the viewpoint of the overall operation of a dual file system, the use of another volume should be avoided wherever practicable, and therefore such a manner of operation is not desirable.

According to the prior art described above, when a dual file system is to be re-actuated, information indicating the state of correspondence between the volumes and media regarding dual files before a system stop is not inherited by the re-actuated system. As a result, since no allocation of the volume in an off-line state into which the blockaded medium was assembled takes place for the dual files including the blockaded medium, there is the disadvantage that, after re-actuation, the dual files including the blockaded medium are operated in a non-dual state, and it is impossible to recover the dual file system into the same state of the volumes and media including the dual files as during the operation before the system stop.

An object of the present invention is to obviate this disadvantage of the prior art, and to provide an apparatus to manage information indicating correspondence between volumes and media in a dual file system which enables the dual file system after re-actuation to operate in the same state of the volumes and media as during the operation before the system stop.

SUMMARY OF THE INVENTION

A management apparatus for volume-medium correspondence information for use in a dual file system according to a first aspect of the present invention has the following configuration.

A volume-medium correspondence information management table stores volume-medium correspondence information during the operation of the dual file system.

A volume-medium correspondence information storage file, after a stop of said dual file system, stores volume-medium correspondence information which was in said volume-medium correspondence information management table immediately before that system stop.

Volume-medium correspondence information setting/updating means updates volume-medium correspondence information in said volume-medium correspondence information management table when the media constituting dual files are to be altered and when the volumes into which the media are to be assembled are to be altered.

Write means, during the operation of said dual file system, writes the latest volume-medium correspondence information in said volume-medium correspondence information management table into said volume-medium correspondence information storage file.

Recovery means, when said dual file system is to be reactuated, recovers volume-medium correspondence information stored in said volume-medium correspondence information file into said volume-medium correspondence information table after the re-actuation.

Provisional volume allocation means, when said dual file system is to be re-actuated, provisionally allocates the volumes in an off-line state to dual files including a blockaded medium on the basis of the volume-medium correspondence information in said volume-medium correspondence information table recovered by the recovery means.

A management apparatus for volume-medium correspondence information for use in a dual file system according to a second aspect of the invention further has the following configuration in the management apparatus for volume-medium correspondence information for use in a dual file system according to the first aspect of the invention.

Said write means presets a fixed time interval during which no updating of volume-medium correspondence information in said volume-medium correspondence information management table is likely to take place, and writes volume-medium correspondence information in said volume-medium correspondence information management table into said volume-medium correspondence information storage file every time this fixed time interval has passed.

A management apparatus for volume-medium correspondence information for use in a dual file system according to a third aspect of the invention further has the following configuration in the management apparatus for volume-medium correspondence information for use in a dual file system according to the first aspect of the invention.

Said write means writes volume-medium correspondence information in said volume-medium correspondence information management table into said volume-medium correspondence information storage file every time said volume-medium correspondence information setting/updating means updates volume-medium correspondence information in said volume-medium correspondence information management table.

BRIEF DESCRIPTION OF THE DRAWINGS

The above-mentioned and other objects, features and advantages of the present invention will become more apparent from the following detailed description when taken in conjunction with the accompanying drawings, wherein:

FIG. 2 is a diagram illustrating the configuration of volume-medium correspondence information to be stored by the volume-medium correspondence information management table 2 and the volume-medium correspondence information storage file 6 in the first, second and third preferred embodiments of the invention;

FIG. 4 is a flow chart showing the processing by the write means 4 in the second and third embodiments of the invention.

In the figures, the same reference numerals denote respectively the same constituent elements.

DETAILED DESCRIPTION OF THE PREFERRED EMBODIMENTS

Figure 1:
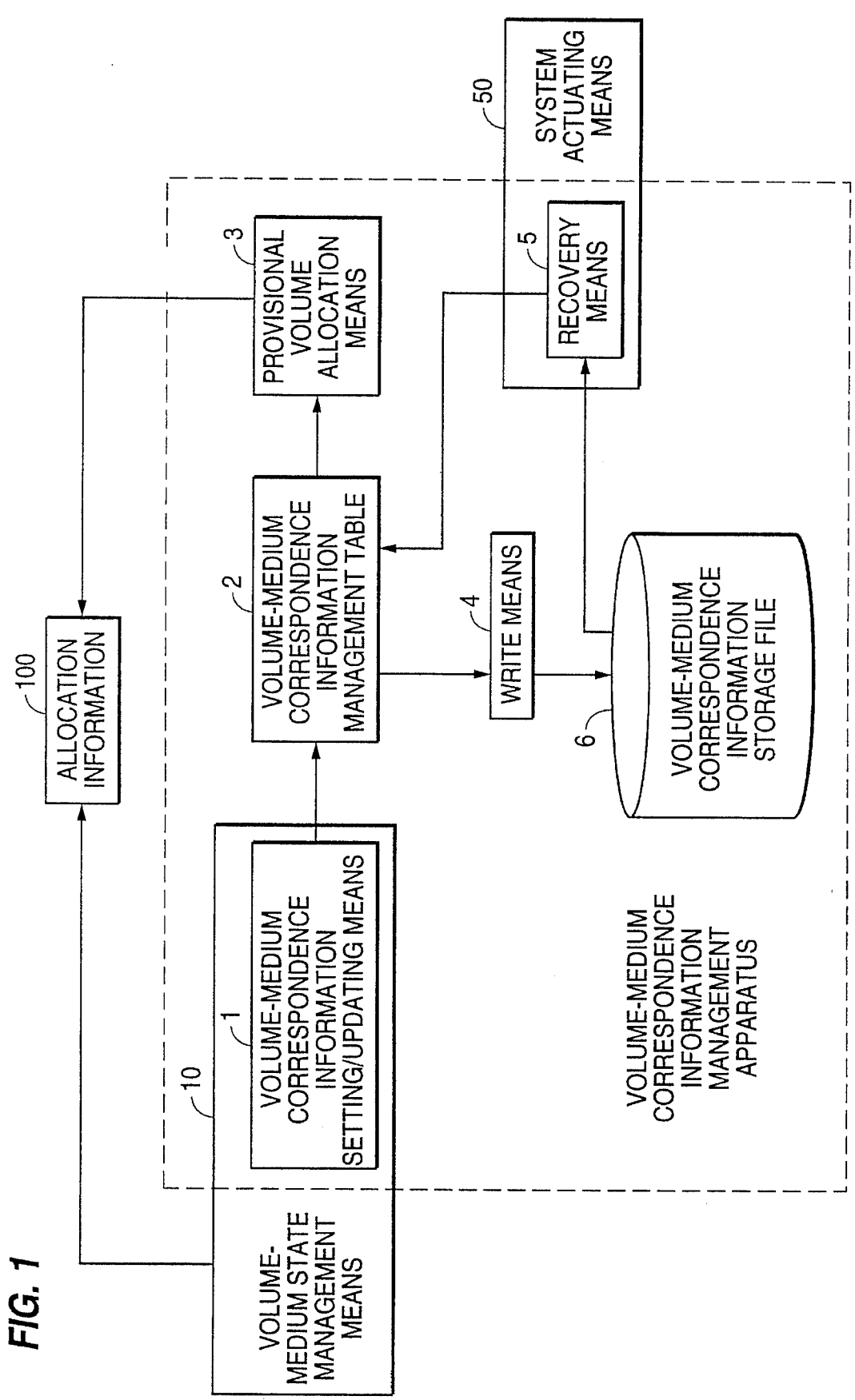
FIG. 1 is a block diagram illustrating first, second and third preferred embodiments of the invention.

Referring to FIG. 1, a management apparatus for volume-medium correspondence information for use in a dual file system which is a first preferred embodiment of the present invention has the following configuration.

A volume-medium correspondence information management table 2 stores volume-medium correspondence information during the operation of the dual file system.

A volume-medium correspondence information storage file 6, after a stop of the dual file system, stores volume-medium correspondence information which was in the volume-medium correspondence information management table 2 immediately before that system stop.

Volume-medium correspondence information setting/updating means 1 in volume-medium state management means 10 updates volume-medium correspondence information in the volume-medium correspondence information management table 2 when the media constituting dual files are to be altered and when the volumes into which the media are to be assembled are to be altered.

Write means 4, during the operation of the dual file system, writes the latest volume-medium correspondence information in the volume-medium correspondence information management table 2 into the volume-medium correspondence information storage file 6.

Recovery means 5 in system actuating means 50, when the dual file system is to be re-actuated, recovers volume-medium correspondence information, which is stored in the volume-medium correspondence information file 6, in the volume-medium correspondence information table 2 after the re-actuation.

Provisional volume allocation means 3, when the dual file system is to be re-actuated, provisionally allocates the volumes in an off-line state to dual files including a blockaded medium on the basis of the volume-medium correspondence information in the volume-medium correspondence information table 2 recovered by the recovery means 5.

Besides these, allocation information 100 set by the provisional volume allocating means 3 and the volume-medium state management means 10 is present outside the volume-medium correspondence information management apparatus.

FIG. 2 illustrates the configuration of volume-medium correspondence information in the volume-medium correspondence information storage file 6. The volume-medium correspondence information indicates correspondence between the names of media with respect to each pair of dual files on the first and second lines of the dual file system and the names of the volumes into which the respective media are assembled.

Figure 3:
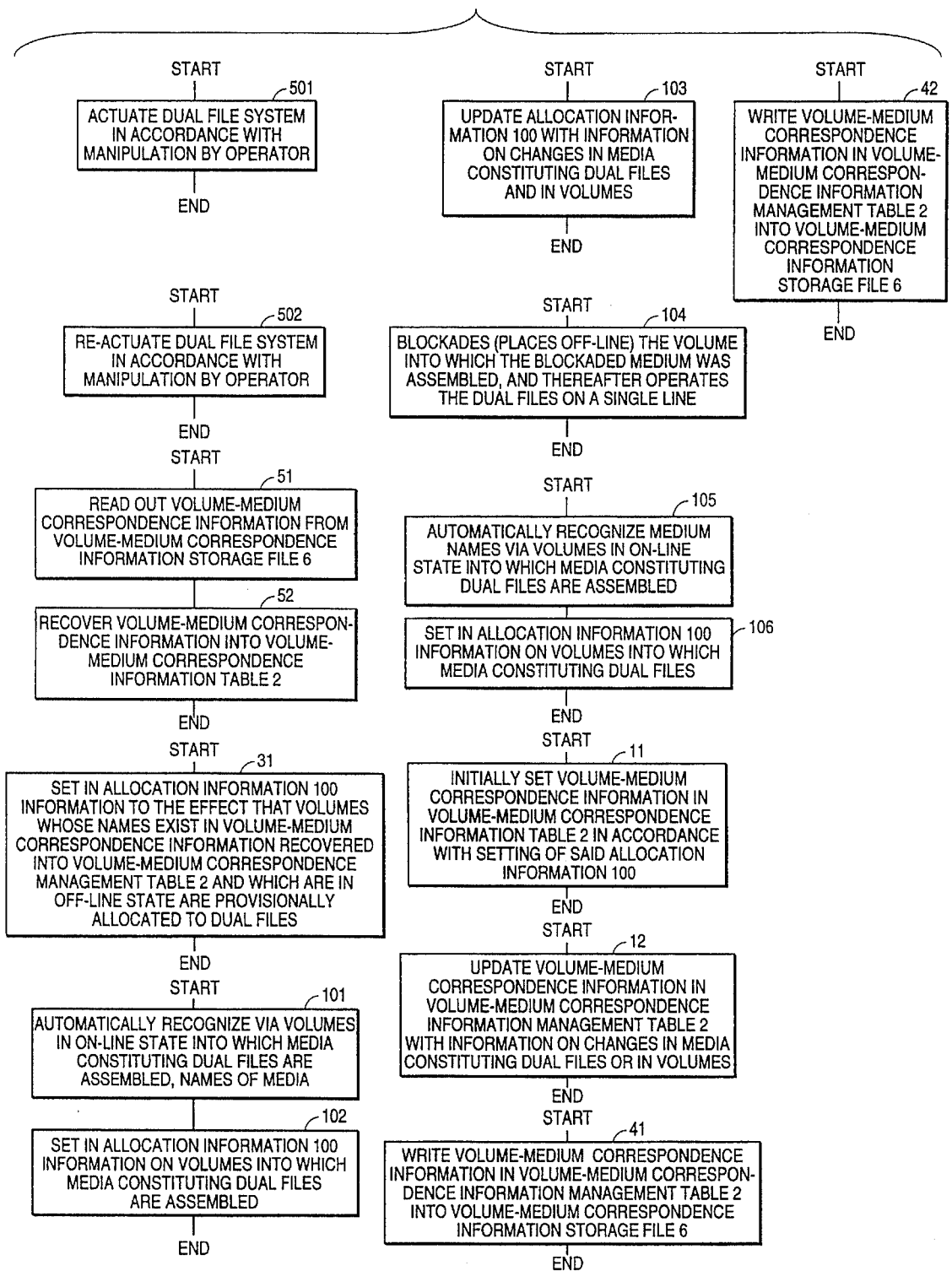
FIG. 3 is a flow chart showing the processings by the system re-actuating means 50, volume-medium state management means 10, volume-medium correspondence information setting/updating means 1, write means 4, recovery means 5 and provisional volume allocation means 3 in the first embodiment of the invention.

Next will be described in detail the operation of the first preferred embodiment of the invention with reference to FIGS. 1 through 3.

First will be described a situation to which this embodiment is to be applied.

(1) During the operation of a dual file system after its actuation, one of the media constituting a pair of dual files in a dual state runs into failure for some reason. As a result, the volume into which the blockaded medium was assemble goes off-line state, and thereafter the dual files operate on a single line.

(2) Afterwards, the dual file system stops for some reason.

(3) Still later, the dual file system is re-actuated.

The actuating procedure of the dual file system will be described below.

The system actuating means 50, in accordance with manipulation by the operator, actuates and begins the operation of the dual file system (step 501).

The volume-medium state management means 10 of the dual file system, via volumes in an on-line state into which media constituting dual files are assembled, automatically recognizes the names of the media (step 101) and, if it succeeds in recognizing a pair of media which are to constitute dual files, sets in the allocation information 100 information to the effect that the volumes into which those media are assembled are allocated to those dual files (step 102). The dual files for which such setting in the allocation information 100 has been accomplished are thereafter operated in a dual state.

The volume-medium correspondence information setting/ updating means 1 in the volume-medium state management means 10 performs the initial setting of volume-medium correspondence information, such as shown in FIG. 2, in the volume-medium correspondence information table 2 in accordance with the setting of said allocation information 100 (step 11).

The write means 4 writes volume-medium correspondence information in the volume-medium correspondence information management table 2 into the volume-medium correspondence information storage file 6 (step 41).

Now will be described the actions during the operation of the dual file system.

If, during the operation of the dual file system, any change occurs in media constituting dual files in a dual state or in volumes into which the media are assembled, the volume-medium correspondence information setting/updating means 1 so updates volume-medium correspondence information in the volume-medium correspondence information management table 2 as to reflect that change (step 12). Thus, it updates the volume names and medium names in FIG. 2 regarding the dual files with respect to which the change has arisen. At the same time, the volume-medium state management means 10 updates the allocation information 100 to reflect said changes in volumes and media (step 103).

The write means 4 writes into the volume-medium correspondence information storage file 6 so as to reflect the changes in the volume-medium correspondence information in the volume-medium correspondence information management table 2 (step 42). Thus the write means 4 writes the latest volume-medium correspondence information into the volume-medium correspondence information storage file 6.

The following is a description of the actions which take place when, during the operation of this dual file system, a medium constituting one of the dual files in a dual state runs into failure.

The volume-medium state management means 10, upon recognition of the occurrence of failure, blockades (places off line) the volume into which the blockaded medium was assembled, and thereafter operates the dual files including the blockaded medium on a single line (step 104). However, as the information regarding the dual files remains in the allocation information 100, the dual state of the dual files is maintained.

Now will be described the actions which take place when the dual file system stops for some reason after the occurrence of failure and is to be re-actuated.

The system actuating means 50, in accordance with manipulation by the operator, re-actuates the dual file system (step 502). In performing this re-actuation, the recovery means 5 in the system actuating means 50 reads out the volume-medium correspondence information which had been written into the volume-medium correspondence information storage file 6 at step 42 as the latest information and were in store at the time of the system stop (step 51), and stores that volume-medium correspondence information into the volume-medium correspondence information table 2 (step 52).

The volume-medium state management means 10, as at the time of actuating the dual file system at steps 101 and 102, automatically recognizes, via volumes in an on-line state into which media constituting dual files are assembled, the names of the media (step 105), and sets in the allocation information 100 information to the effect that the volumes into which those media are assembled are allocated to those dual files (step 106).

The provisional volume allocation means 3 sets in the allocation information 100 information to the effect that volumes whose names exist in the volume-medium correspondence information recovered into the volume-medium correspondence management table 2 and which are in an off-line state (volumes which were not automatically recognized at step 105) are provisionally allocated to the dual files (step 31). Such setting is called "provisional allocation".

Hereupon is completed the processing by the volume-medium correspondence information management apparatus in the dual file system, which is the operation of the first preferred embodiment of the present invention.

Since the volume-medium correspondence information management apparatus in the dual file system, which is the first preferred embodiment of the invention, makes possible provisional allocation of the volume into which the blockaded medium was assembled before the occurrence of failure prior to a system stop and further can re-actuate the dual files including the blockaded medium in a dual state, information indicating correspondence between the volume and the medium before the system stop is inherited at the time of re-actuation, and accordingly has the effect of enabling the dual file system to be operated in the same volume-medium state after the re-actuation as during the operation before the system stop.

Referring to FIG. 1, a volume-medium correspondence information management apparatus for use in a dual file system, which is the second preferred embodiment of the invention, further has the following configuration in the management apparatus for volume-medium correspondence information for use in a dual file system, which is the first embodiment of the invention.

The write means 4 writes volume-medium correspondence information in the volume-medium correspondence information management table 2 into the volume-medium correspondence information storage file 6 upon every passage of a fixed time interval during which no updating of volume-medium correspondence information in said volume-medium correspondence information management table 2 is likely to take place.

Next will be described in detail the operation of the second preferred embodiment of the invention with reference to FIGS. 1, 2 and 4.

The write means 4 measures a fixed time interval with a timer (step 43), and writes upon every passage of that time interval volume-medium correspondence information in the volume-medium correspondence information management table 2 into the volume-medium correspondence information storage file 6 (step 44).

The aforementioned "fixed time interval" is preset to be a time interval during which no updating of volume-medium correspondence information in said volume-medium correspondence information management table 2 is likely to take place (a time interval short enough to warrant the non-occurrence of updating with a probability higher than a certain level).

Hereupon is completed the processing by the volume-medium correspondence information management apparatus in the dual file system, which is the operation of the second preferred embodiment of the present invention.

Referring to FIG. 1, a volume-medium correspondence information management apparatus for use in a dual file system, which is the third preferred embodiment of the invention, further has the following configuration in the management apparatus for volume-medium correspondence information for use in a dual file system, which is the first embodiment of the invention.

The write means 4 writes volume-medium correspondence information in the volume-medium correspondence information management table 2 into the volume-medium correspondence information storage file 6 every time the volume-medium correspondence information setting/updating means 1 updates volume-medium correspondence information in the volume-medium correspondence information management table 2.

Next will be described in detail the operation of the third preferred embodiment of the invention with reference to FIGS. 1, 2 and 4.

The write means 4 writes volume-medium correspondence information in the volume-medium correspondence information management table 2 into the volume-medium correspondence information storage file 6 every time the volume-medium correspondence information setting/updating means 1 updates volume-medium correspondence information in the volume-medium correspondence information management table 2 (step 45).

Hereupon is completed the processing by the volume-medium correspondence information management apparatus in the dual file system, which is the operation of the third preferred embodiment of the present invention.

The present invention is characteristic in that it is provided with the volume-medium correspondence information setting/updating means 1 to have changes in media constituting dual files and in the volumes into which the media are to be assembled reflected in the updating of volume-medium correspondence information in the volume-medium correspondence information management table 2; the write means 4 which, during the operation of the dual file system, writes the latest volume-medium correspondence information in the volume-medium correspondence information management table 2 into the volume-medium correspondence information storage file 6; the recovery means 5 which, when the dual file system is to be re-actuated, recovers volume-medium correspondence information, which is stored in the volume-medium correspondence information file 6, in the volume-medium correspondence information table 2 after the re-actuation; and the provisional volume allocation means 3 which, when the dual file system is to be re-actuated, provisionally allocates the volume in an off-line state to dual files including a blockaded medium on the basis of the volume-medium correspondence information table 2.

By virtue of this characteristic, the present invention, when one of the media constituting a pair of dual files runs into failure for some reason, the dual file system stops afterwards and the system is to be re-actuated further afterwards, to provisionally allocate the volume into which the blockaded medium was assembled before the system stop (a volume in an off-line state) at the time of re-actuation by inheriting after the re-actuation the information indicating correspondence between the volume and the medium before the system stop, and accordingly has the effect of enabling the dual file system to be operated in the same volume-medium state after the re-actuation as during the operation before the system stop.

What is claimed is:

1. A management apparatus for volume-medium correspondence information for use in a dual file system, comprising:

a system actuating means responsive to manipulation by an operator, for actuating a dual file system operation, and for reactuating the dual file system operation;

a volume-medium correspondence information management table operable to store volume-medium correspondence information including correspondence between volume name and medium name of a dual file;

a volume-medium correspondence information storage file;

a write means, responsive to an updating of the volume-medium correspondence information in the volume-medium correspondence information management table, for writing a most recent volume-medium correspondence information in the volume-medium correspondence information management table to the volume-medium correspondence information storage file during the dual file system operation;

a volume-medium correspondence information setting/updating means for initializing the volume-medium correspondence information in the volume-medium correspondence information management table; and updating the volume-medium correspondence information into the volume-medium correspondence information management table, responsive to an alteration in allocation information;

a volume-medium state management means for recognizing at least two media constituting dual files via a state of the volume, the name of the volume and the name of the medium; for setting allocation information indicating that the volumes are allocated as dual files; and upon detection of a failure of one of said media in one of said volumes, for placing said failed volume in an off-line state and said failed media in a blockaded state; wherein the dual file system operation is stopped as a result;

a recovery means for recovering the volume-medium correspondence information stored in the volume-medium correspondence information storage file to the volume-medium correspondence information management table responsive to the re-actuation of the dual file system operation; and a provisional volume allocation means, responsive to the re-actuation of the dual file system operation, for setting allocation information provisionally allocating a volume in an off-line state to dual files including a blockaded medium based on the volume-medium correspondence information management table.

2. The management apparatus as claimed in claim 1, wherein the volume-medium correspondence information management table stores the volume-medium correspondence information.

3. The management apparatus as claimed in claim 2, wherein the volume-medium correspondence information storage file stores the volume-medium correspondence information.

4. The management apparatus as claimed in claim 3, wherein the volume-medium correspondence information is stored in the volume-medium correspondence information management table during the dual file system operation, and the volume-medium correspondence information is stored in the volume-medium correspondence information storage file before the dual file system operation is stopped.

5. The management apparatus as claimed in claim 3, wherein the volume-medium correspondence information comprises a volume name and a medium name for each dual file of at least one pair of dual files.

6. The management apparatus as claimed in claim 1, wherein the write means presets a fixed time interval and writes the volume-medium correspondence information in the volume-medium correspondence information management table to the volume-medium correspondence information storage file each time the fixed time interval elapses.

7. The management apparatus as claimed in claim 6, wherein the fixed time interval is a predetermined interval during which no updating of volume-medium correspondence information in the volume-medium correspondence information management table is likely to occur.

8. The management apparatus as claimed in claim 1, wherein the write means writes the volume-medium correspondence information in the volume-medium correspondence information management table to the volume-medium correspondence information storage file when the volume-medium correspondence information setting/updating means updates the volume-medium correspondence information in the volume-medium correspondence information management table.

9. A method for management of volume-medium correspondence information for use in a dual file system, comprising the steps of:

actuating dual file system operation and reactuating the dual file system operation, responsive to manipulation by an operator;

storing volume-medium correspondence information, including correspondence between volume name and medium name of a dual file; in a volume-medium correspondence information management table;

writing a most recent volume-medium correspondence information in the volume-medium correspondence information management table to a volume-medium correspondence information storage file during the dual file system operation, responsive to an updating of the volume-medium correspondence information in the volume-medium correspondence information management table;

initializing the volume-medium correspondence information in the volume-medium correspondence information management table, and updating the volume-medium correspondence information into the volume-medium correspondence information management table, responsive to an alteration in allocation information;

recognizing at least two media constituting dual files via a state of the volume, the name of the volume and the name of the medium; setting allocation information indicating that the volumes are allocated as dual files; and upon detection of a failure of one of said media in one of said volumes, placing said failed volume in an off-line state and said failed media in a blockaded state, wherein the dual file system operation is stopped as a result;

recovering the volume-medium correspondence information stored in the volume-medium correspondence information storage file to the volume-medium correspondence information management table responsive to the re-actuation of the dual file system operation; and setting allocation information provisionally allocating a volume in an off-line state to dual files including a blockaded medium based on the volume-medium correspondence information management table, responsive to the re-actuation of the dual file system operation.

10. The method as claimed in claim 9, comprising the step of storing the volume-management correspondence information in the volume-medium correspondence information management table.

11. The method as claimed in claim 10, comprising the step of storing the volume-medium correspondence information in the volume-medium correspondence information storage file.

12. The method as claimed in claim 11, comprising the step of storing the volume-medium correspondence information in the volume-medium correspondence information management table during the dual file system operation, and storing the volume-medium correspondence information in the volume-medium correspondence information storage file before the dual file system operation is stopped.

13. The method as claimed in claim 11, wherein the volume-medium correspondence information comprises a volume name and a medium name for each dual file of at least one pair of dual files.

14. The method as claimed in claim 9, further comprising the step of presetting a fixed time interval, and writing the volume-medium correspondence information in the volume-medium correspondence information management table to the volume-medium correspondence information storage file each time the fixed time interval elapses.

15. The method as claimed in claim 14, wherein the fixed time interval is a predetermined interval during which no updating of volume-medium correspondence information in the volume-medium correspondence information management table is likely to occur.

16. The method as claimed in claim 9, further comprising the step of writing the volume-medium correspondence information in the volume-medium correspondence information management table to the volume-medium correspondence information storage file when the volume-medium correspondence information is updated in the volume-medium correspondence information management table.

17. The management apparatus as claimed in claim 1, wherein the volume-medium state management means is further activated on re-actuating the dual file system.

* * * * *